(12) United States Patent
Kolker et al.

(10) Patent No.: US 9,347,978 B2
(45) Date of Patent: May 24, 2016

(54) ARC FAULT DETECTOR WITH CIRCUIT INTERRUPTER

(71) Applicant: Leviton Manufacturing Co., Inc., Melville, NY (US)

(72) Inventors: David Kolker, Rego Park, NY (US); Roger M. Bradley, North Bellmore, NY (US); Ross Memyk, Brooklyn, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 396 days.

(21) Appl. No.: 14/042,075

(22) Filed: Sep. 30, 2013

(65) Prior Publication Data
US 2014/0104731 A1    Apr. 17, 2014

Related U.S. Application Data

(60) Continuation of application No. 13/080,040, filed on Apr. 5, 2011, which is a continuation of application No. 12/032,431, filed on Feb. 15, 2008, which is a continuation of application No. 11/357,708, filed on Feb. 17, 2006, which is a division of application No. 10/263,919, filed on Oct. 3, 2002.

(51) Int. Cl.
| | |
|---|---|
| *G01R 31/02* | (2006.01) |
| *H02H 3/16* | (2006.01) |
| *H02H 1/00* | (2006.01) |
| *G01R 31/12* | (2006.01) |
| *H02H 3/33* | (2006.01) |
| *H02H 3/44* | (2006.01) |

(52) U.S. Cl.
CPC ........... *G01R 31/025* (2013.01); *H02H 1/0015* (2013.01); *H02H 3/162* (2013.01); *G01R 31/1272* (2013.01); *H02H 3/334* (2013.01); *H02H 3/44* (2013.01)

(58) Field of Classification Search
CPC ......... G01R 31/025; H02H 3/162; H02H 3/44
USPC .......................................................... 361/42
See application file for complete search history.

(56) References Cited

U.S. PATENT DOCUMENTS

| | | |
|---|---|---|
| 3,904,859 A | 9/1975 | Poncelet |
| 4,356,443 A | 10/1982 | Emery |
| 4,376,243 A | 3/1983 | Renn et al. |
| 4,466,071 A | 8/1984 | Russell, Jr. |

(Continued)

FOREIGN PATENT DOCUMENTS

WO      2005062917 A2      7/2005

OTHER PUBLICATIONS

"Technology for Detecting and Monitoring Conditions that Could Cause Electrical Wiring System Fires", UL Underwriters Laboratories, Inc., Sep. 1995.

*Primary Examiner* — Scott Bauer
(74) *Attorney, Agent, or Firm* — Carter, DeLuca, Farrell & Schmidt, LLP

(57) ABSTRACT

There is here disclosed a method and apparatus for detecting the occurrence of arcing of a conductor by monitoring the current on an AC power line. The signal detected is split and directed along four separate paths to generate four signals having separate characteristics which represent the current in the line. Upon the detection of arcing, an output signal can be generated to activate a circuit interrupting mechanism, sound an audio alarm and/or alert a central monitoring station.

10 Claims, 10 Drawing Sheets

(56) References Cited

U.S. PATENT DOCUMENTS

| | | | |
|---|---|---|---|
| 4,618,907 | A | 10/1986 | Leopold |
| 4,658,322 | A | 4/1987 | Rivera |
| 4,709,293 | A | 11/1987 | Gershen et al. |
| 4,851,782 | A | 7/1989 | Jeerings et al. |
| 4,853,818 | A | 8/1989 | Emery et al. |
| 4,878,144 | A | 10/1989 | Nebon |
| 4,931,894 | A | 6/1990 | Legatti |
| 4,933,630 | A | 6/1990 | Dupraz |
| 4,939,495 | A | 7/1990 | Peterson et al. |
| 5,121,282 | A | 6/1992 | White |
| 5,185,684 | A | 2/1993 | Beihoff et al. |
| 5,185,686 | A | 2/1993 | Hansen et al. |
| 5,202,662 | A | 4/1993 | Bienwald et al. |
| 5,206,596 | A | 4/1993 | Beihoff et al. |
| 5,223,795 | A | 6/1993 | Blades |
| 5,224,006 | A | 6/1993 | MacKenzie et al. |
| 5,280,404 | A | 1/1994 | Ragsdale |
| 5,383,799 | A | 1/1995 | Fladung |
| 5,420,740 | A * | 5/1995 | MacKenzie ............ H02H 3/33 361/113 |
| 5,432,455 | A | 7/1995 | Blades |
| 5,434,509 | A | 7/1995 | Blades |
| 5,459,630 | A | 10/1995 | MacKenzie et al. |
| 5,519,561 | A | 5/1996 | Mrenna et al. |
| 5,536,980 | A | 7/1996 | Kawate et al. |
| 5,561,505 | A | 10/1996 | Lewis |
| 5,561,605 | A | 10/1996 | Zuercher et al. |
| 5,590,012 | A | 12/1996 | Dollar, II |
| 5,600,524 | A | 2/1997 | Neiger et al. |
| 5,682,101 | A | 10/1997 | Brooks et al. |
| 5,689,180 | A | 11/1997 | Carlson |
| 5,706,159 | A | 1/1998 | Dollar, II et al. |
| 5,715,125 | A | 2/1998 | Neiger et al. |
| 5,729,145 | A | 3/1998 | Blades |
| 5,796,259 | A * | 8/1998 | Dickmander .......... G01R 31/08 324/108 |
| 5,805,397 | A | 9/1998 | MacKenzie |
| 5,805,398 | A | 9/1998 | Rae |
| 5,815,352 | A | 9/1998 | Mackenzie |
| 5,818,237 | A | 10/1998 | Zuercher et al. |
| 5,818,671 | A | 10/1998 | Seymour et al. |
| 5,825,598 | A | 10/1998 | Dickens et al. |
| 5,834,940 | A | 11/1998 | Brooks et al. |
| 5,835,321 | A | 11/1998 | Elms et al. |
| 5,839,092 | A | 11/1998 | Erger et al. |
| 5,847,913 | A | 12/1998 | Turner et al. |
| 5,886,606 | A | 3/1999 | Tosaka et al. |
| 5,906,517 | A | 5/1999 | Crane et al. |
| 5,933,305 | A | 8/1999 | Schmalz et al. |
| 5,940,256 | A | 8/1999 | MacKenzie et al. |
| 5,946,179 | A | 8/1999 | Fleege et al. |
| 5,963,406 | A | 10/1999 | Neiger et al. |
| 5,982,596 | A | 11/1999 | Spencer et al. |
| 5,986,860 | A | 11/1999 | Scott |
| 5,999,384 | A | 12/1999 | Chen et al. |
| 6,057,997 | A | 5/2000 | Mackenzie et al. |
| 6,088,205 | A | 7/2000 | Neiger et al. |
| 6,128,169 | A | 10/2000 | Neiger et al. |
| 6,191,589 | B1 | 2/2001 | Clunn |
| 6,195,241 | B1 | 2/2001 | Brooks et al. |
| 6,198,611 | B1 | 3/2001 | Macbeth |
| 6,218,844 | B1 | 4/2001 | Wong et al. |
| 6,226,161 | B1 | 5/2001 | Neiger et al. |
| 6,246,556 | B1 | 6/2001 | Haun et al. |
| 6,259,996 | B1 | 7/2001 | Haun et al. |
| 6,266,219 | B1 | 7/2001 | Macbeth et al. |
| 6,275,044 | B1 | 8/2001 | Scott |
| 6,295,190 | B1 | 9/2001 | Rinaldi et al. |
| 6,313,641 | B1 | 11/2001 | Brooks |
| 6,339,525 | B1 | 1/2002 | Neiger et al. |
| 6,359,745 | B1 | 3/2002 | Thomas, III et al. |
| 6,362,628 | B2 | 3/2002 | Macbeth et al. |
| 6,370,001 | B1 | 4/2002 | Macbeth |
| 6,373,257 | B1 | 4/2002 | Macbeth et al. |
| 6,377,055 | B1 | 4/2002 | Macbeth et al. |
| 6,381,112 | B1 | 4/2002 | DiSalvo |
| 6,388,849 | B1 | 5/2002 | Rae |
| 6,407,893 | B1 | 6/2002 | Neiger et al. |
| 6,417,671 | B1 | 7/2002 | Tiemann |
| 6,421,214 | B1 | 7/2002 | Packard et al. |
| 6,426,632 | B1 | 7/2002 | Clunn |
| 6,426,634 | B1 | 7/2002 | Clunn et al. |
| 6,433,977 | B1 | 8/2002 | Macbeth |
| 6,433,978 | B1 | 8/2002 | Neiger et al. |
| 6,504,692 | B1 | 1/2003 | Macbeth et al. |
| 6,522,509 | B1 | 2/2003 | Engel et al. |
| 6,538,862 | B1 | 3/2003 | Mason, Jr. et al. |
| 6,538,863 | B1 | 3/2003 | Macbeth |
| 6,545,574 | B1 | 4/2003 | Seymour et al. |
| 6,567,250 | B1 | 5/2003 | Haun et al. |
| 6,570,392 | B2 | 5/2003 | Macbeth et al. |
| 6,577,484 | B1 | 6/2003 | Stanley et al. |
| 6,608,741 | B1 | 8/2003 | Macbeth |
| 6,621,388 | B1 | 9/2003 | Macbeth |
| 6,628,486 | B1 | 9/2003 | Macbeth |
| 6,628,487 | B1 | 9/2003 | Macbeth |
| 6,633,467 | B2 | 10/2003 | Macbeth et al. |
| 6,639,769 | B2 | 10/2003 | Neiger et al. |
| 6,642,832 | B2 | 11/2003 | Pellon et al. |
| 6,654,219 | B1 | 11/2003 | Romano et al. |
| 6,707,651 | B2 | 3/2004 | Elms et al. |
| 6,720,872 | B1 | 4/2004 | Engel et al. |
| 6,731,483 | B2 | 5/2004 | Mason, Jr. et al. |
| 6,762,920 | B2 | 7/2004 | Parker |
| 6,782,329 | B2 | 8/2004 | Scott |
| 6,785,104 | B2 | 8/2004 | Tallman et al. |
| 6,798,628 | B1 | 9/2004 | Macbeth |
| 6,807,035 | B1 | 10/2004 | Baldwin et al. |
| 6,807,036 | B2 | 10/2004 | Baldwin |
| 6,810,069 | B2 | 10/2004 | Kojovic et al. |
| 6,839,208 | B2 | 1/2005 | Macbeth et al. |
| 6,876,528 | B2 | 4/2005 | Macbeth |
| 6,876,529 | B2 | 4/2005 | Macbeth |
| 6,937,027 | B2 | 8/2005 | Koo et al. |
| 6,943,558 | B2 | 9/2005 | Hale et al. |
| 6,972,572 | B2 | 12/2005 | Mernyk et al. |
| 6,972,937 | B1 | 12/2005 | Macbeth et al. |
| 6,987,389 | B1 | 1/2006 | Macbeth et al. |
| 6,999,289 | B2 | 2/2006 | Macbeth et al. |
| 7,003,435 | B2 | 2/2006 | Kolker et al. |
| 7,009,406 | B2 | 3/2006 | Naidu et al. |
| 7,035,066 | B2 | 4/2006 | McMahon et al. |
| 7,064,944 | B2 | 6/2006 | Kim et al. |
| 7,068,045 | B2 | 6/2006 | Zuercher et al. |
| 7,068,481 | B2 | 6/2006 | Radosavljevic et al. |
| 7,110,864 | B2 | 9/2006 | Restrepo et al. |
| 7,149,065 | B2 | 12/2006 | Baldwin et al. |
| 7,161,775 | B2 | 1/2007 | Schmalz |
| 7,180,299 | B2 | 2/2007 | Mernyk et al. |
| 7,180,717 | B2 | 2/2007 | Kojovic et al. |
| 7,190,562 | B2 | 3/2007 | Pellon et al. |
| 7,215,520 | B2 | 5/2007 | Elms et al. |
| 7,227,441 | B2 | 6/2007 | Skendzic et al. |
| 7,253,603 | B2 | 8/2007 | Kovanko et al. |
| 7,253,637 | B2 | 8/2007 | Dvorak et al. |
| 7,253,640 | B2 | 8/2007 | Engel et al. |
| 7,253,996 | B2 | 8/2007 | Elms et al. |
| 7,259,568 | B2 | 8/2007 | Mernyk et al. |
| 7,268,989 | B2 | 9/2007 | Parker et al. |
| 7,298,598 | B1 | 11/2007 | Morgan et al. |
| 7,304,820 | B2 | 12/2007 | Kato et al. |
| 7,304,829 | B2 | 12/2007 | Nadipuram et al. |
| 7,307,820 | B2 | 12/2007 | Henson et al. |
| 7,309,993 | B2 | 12/2007 | Driehorn et al. |
| 7,319,574 | B2 | 1/2008 | Engel |
| 7,321,227 | B2 | 1/2008 | Fritsch et al. |
| 7,333,920 | B2 | 2/2008 | Kolker et al. |
| 7,349,188 | B2 | 3/2008 | Zuercher et al. |
| 7,359,168 | B2 | 4/2008 | Elms et al. |
| 7,362,552 | B2 | 4/2008 | Elms et al. |
| 7,368,918 | B2 | 5/2008 | Henson et al. |
| 7,403,129 | B2 | 7/2008 | Zhou et al. |
| 7,405,569 | B2 | 7/2008 | Hagel et al. |
| 7,440,245 | B2 | 10/2008 | Miller et al. |

(56) References Cited

U.S. PATENT DOCUMENTS

| | | |
|---|---|---|
| 7,440,250 B2 | 10/2008 | Terhorst |
| 7,441,173 B2 | 10/2008 | Restrepo et al. |
| 7,443,644 B2 | 10/2008 | Sung |
| 7,460,346 B2 | 12/2008 | Deshpande et al. |
| 7,463,037 B2 | 12/2008 | Henson et al. |
| 7,486,492 B2 | 2/2009 | Elms |
| 7,492,163 B2 | 2/2009 | Restrepo et al. |
| 7,492,562 B2 | 2/2009 | Evans et al. |
| 7,518,840 B2 | 4/2009 | Elms |
| 7,535,234 B2 | 5/2009 | Mernyk et al. |
| 7,558,033 B2 | 7/2009 | Zhou et al. |
| 7,570,465 B2 | 8/2009 | Beatty, Jr. et al. |
| 7,633,729 B2 | 12/2009 | Oldenburg et al. |
| 7,864,492 B2 | 1/2011 | Restrepo et al. |
| 7,925,458 B2 | 4/2011 | Kolker et al. |
| 7,944,654 B2 | 5/2011 | Scott et al. |
| 7,986,148 B2 | 7/2011 | Mernyk et al. |
| 8,023,235 B2 | 9/2011 | Bilac et al. |
| 8,054,591 B2 | 11/2011 | Changali et al. |
| 8,054,592 B2 | 11/2011 | Rivers, Jr. |
| 8,564,307 B2 | 10/2013 | Kolker et al. |
| 2002/0008597 A1 | 1/2002 | Otsuka et al. |
| 2002/0033701 A1 | 3/2002 | Macbeth et al. |
| 2003/0072113 A1 | 4/2003 | Wong et al. |
| 2004/0100274 A1 | 5/2004 | Gloster et al. |
| 2005/0052809 A1 | 3/2005 | Evans et al. |
| 2005/0063535 A1 | 3/2005 | Walbeck et al. |
| 2005/0191902 A1 | 9/2005 | Kim et al. |
| 2005/0203672 A1 | 9/2005 | Restrepo et al. |
| 2005/0286184 A1 | 12/2005 | Campolo |
| 2005/0286185 A1 | 12/2005 | Henson et al. |
| 2006/0171085 A1 | 8/2006 | Keating |
| 2006/0227469 A1 | 10/2006 | Parker et al. |
| 2007/0091520 A1 | 4/2007 | Angelides et al. |
| 2007/0159738 A1 | 7/2007 | Natili et al. |
| 2007/0208520 A1 | 9/2007 | Zhang et al. |
| 2007/0208981 A1 | 9/2007 | Restrepo et al. |
| 2007/0210787 A1 | 9/2007 | Ebenezer et al. |
| 2007/0236208 A1 | 10/2007 | Kojovic et al. |
| 2007/0247767 A1 | 10/2007 | Zhang |
| 2007/0252603 A1 | 11/2007 | Restrepo et al. |
| 2007/0262780 A1 | 11/2007 | Mernyk et al. |
| 2007/0290695 A1 | 12/2007 | Mahon |
| 2008/0024140 A1 | 1/2008 | Henson et al. |
| 2008/0091308 A1 | 4/2008 | Henson et al. |
| 2008/0106254 A1 | 5/2008 | Kojovic |
| 2008/0106832 A1 | 5/2008 | Restrepo et al. |
| 2008/0140354 A1 | 6/2008 | Kolker et al. |
| 2008/0204949 A1 | 8/2008 | Zhou et al. |
| 2008/0204955 A1 | 8/2008 | Parker et al. |
| 2009/0198459 A1 | 8/2009 | Bilac et al. |
| 2009/0207535 A1 | 8/2009 | Mernyk et al. |
| 2009/0248329 A1 | 10/2009 | Restrepo |
| 2010/0085206 A1 | 4/2010 | Nayak et al. |
| 2010/0149711 A1 | 6/2010 | Larson et al. |
| 2011/0181296 A1 | 7/2011 | Kolker et al. |

* cited by examiner

ARC FAULT DETECTOR WITH CIRCUIT INTERRUPTER

PRIORITY

This application is a continuation application of an application filed on Apr. 5, 2011 titled "Arc Fault Detector With Circuit Interrupter" and assigned U.S. application Ser. No. 13/080,040 which is a continuation application of an application filed on Feb. 15, 2008 titled "Arc Fault Detector With Circuit Interrupter" and assigned U.S. application Ser. No. 12/032,431 which is a continuation application of an application filed on Feb. 17, 2006 titled "Arc Fault Detector With Circuit Interrupter" and assigned U.S. application Ser. No. 11/357,708 which is a divisional application of an application filed on Oct. 3, 2002 titled "Arc Fault Detector With Circuit Interrupter" and assigned U.S. application Ser. No. 10/263,919. The entire contents of these applications are incorporated herein by reference.

BACKGROUND OF THE INVENTION

1. Field of the Invention

The present invention relates to arc fault detection and more particularly to apparatus and method for a stand alone arc fault detector and an arc fault detector in combination with a circuit interrupter device.

2. Description of the Prior Art

Circuit breakers, fuses and ground fault circuit interrupters (GFCIs) are commonly used devices for protecting people and property from dangerous electrical faults. Fatalities and loss of property, however, still occur, being caused by electrical faults that go undetected by these protective devices. One such type of electrical fault that typically goes undetected is arc faults. Arcs are potentially dangerous due to the high temperatures of the arcs. Thus, arcs have a high potential of creating damage, mostly through the initiation of fires. An arc, however, will only trip a GFCI if it produces sufficient current leakage to ground. In addition, an arc will trip a breaker only if the current, flowing through the arc, exceeds the trip parameters of the thermal/magnetic mechanism of the breaker. Therefore, a protection device that can detect and interrupt arcs that are not detectable by present day devices is needed. A protection device that is used to detect arcs and whose output is used to trigger a circuit interrupting mechanism is referred to as an Arc Fault Circuit Interrupter (AFCI).

The Consumer Product Safety Commission (CPSC), in 1992 estimated that "there were 41,000 fires involving home electrical wiring systems . . . which resulted in 320 deaths, 1600 injuries and $511 million in property losses." The CPSC further stated that "an electrically caused fire may occur if electrical energy is unintentionally converted to thermal energy and if the heat so generated is transferred to a combustible material at such a rate and for such a time as to cause the material to reach its ignition temperature." The two main causes of the unintentional conversion of electrical energy to heat are excessive current and arcing. Circuit breakers and fuses are currently available to mitigate the results of excessive current, but no commercial system exists to mitigate arcing.

A dangerous condition may develop whenever prolonged arcing exists regardless of whether it involves industrial, commercial or residential power lines. However, mobile homes and especially homes with antiquated wiring systems are particularly vulnerable to fires which are started due to electrical causes. CPSC studies have shown that the frequency of wiring system fires is disproportionately high in homes that are over 40 years old.

The causes of arcing are numerous, for example: aged or worn insulation and wiring; mechanical and electrical stress caused by overuse, over currents or lightning strikes; loose connections; and, excessive mechanical damage to insulation and wires. Two types of arcing occur in residential and commercial buildings: contact arcing and line arcing. Contact or series arcing occurs between two contacts in series with a load. In this instance the load controls the current flowing in the arc. Line or parallel arcing occurs between lines or between a line and ground. In this instance the arc is in parallel with any load present and the source impedance provides the only limit to the current flowing in the arc. It is important for any arc detection system that both contact arcing and line arcing be detected and that appropriate action be taken depending upon the severity of the arc.

An example of contact arcing is illustrated in FIG. 1. The conductors 114, 116 comprising the cable 110, are separated from each other and surrounded by an insulator 112. A portion of the conductor 114 is broken, creating a series gap 118 in conductor 114. Under certain conditions, arcing will occur across this gap, producing a large amount of localized heat. The heat generated by the arcing might be sufficient to break down and carbonize the insulation close to the arc 119. If the arc is allowed to continue, enough heat may be generated to start a fire.

A schematic diagram illustrating an example of line arcing is shown in FIG. 2. Cable 120 comprises electrical conductors 124, 126 covered by outer insulation 122 and separated by inner insulation 128. Deterioration or damage to the inner insulation at 121 may cause line fault arcing 123 to occur between the two conductors 124, 126. The deterioration or damage to the inner insulation could have been caused by an earlier lightning strike to the wiring system which could result in carbonizing the insulation, or it could have been cut by mechanical action such as a metal chair leg cutting into an extension cord.

The potentially devastating results of arcing are widely known and a number of methods of detecting arcs have been developed in the prior art. A large percentage of the prior art refers to detecting the high frequency signals generated on the AC line by arcs.

One major problem associated with any type of arc detection is false tripping. False tripping occurs when an ac detector produces a warning output, or disconnects a section of wiring from the voltage source, when a dangerous arcing condition does not actually exist. The two major causes of false tripping can be normal appliance arcing or the inrush currents created by inductive and capacitive appliances. These two situations generate high frequency signals on the power line that are very similar to those generated by dangerous arcing. Thus, to be a viable commercial device, an arc detector must be able to distinguish arcing signals from signals created by normal appliance use.

A wide range of prior art exists in the field of arc detection. Some of the prior art refers to specialized instances of arcing. For example, U.S. Pat. No. 4,376,243, issued to Renn, et al, discloses a device that operates with DC current. U.S. Pat. No. 4,658,322, issued to Rivera, discloses a device that detects arcing within an enclosed unit of electrical equipment. U.S. Pat. No. 4,878,144, issued to Nebon, discloses a device that detects the light produced by an arc between the contacts of a circuit breaker.

In addition, there are several patents that refer to detecting arcs of AC power lines that disclose various methods of detecting high frequency arcing signals. For example, U.S. Pat. Nos. 5,185,684 and 5,206,596, both issued to Beihoffet al., employ a complex detection means that separately detects the electric field and the magnetic field produced around a wire. U.S. Pat. No. 5,590,012, issued to Dollar, disclosed measuring the high frequency current in a shunted path around an inductor placed in the line, which can be the magnetic trip mechanism of a breaker. In a second detection circuit proposed by Dollar, a high frequency voltage signal is extracted from the line via a high pass filter placed in parallel with a load.

Various methods can be found in the prior art to authenticate arcing and to differentiate arcing from other sources of noise. U.S. Pat. No. 5,280,404, issued to Ragsdale, discloses looking for series arcing by converting the arcing signals to pulses and counting the pulses.

In addition, several patents detect arcing by taking the first derivative or second derivative of the detected signal. For example, see U.S. Pat. No. 5,224,006, issued to MacKenzie et al., and U.S. Pat. Nos. 5,185,684 and 5,206,596, issued to Beihoffet al.

Blades uses several methods to detect arcs as disclosed in U.S. Pat. Nos. 5,223,795; 5,432,455 and 5,434,509. The Blades device is based on the fact that detected high frequency noise must include gaps at each zero crossing, i.e., half cycle, of the AC line. To differentiate arcing from other sources of noise, the Blades device measures the randomness and/or wide bandwidth characteristics of the detected high frequency signal. The device disclosed in U.S. Pat. No. 5,434,509 uses the fast rising edges of arc signals as a detection criterion and detects the short high frequency bursts associated with intermittent arcs.

U.S. Pat. No. 6,561,605, issued to Zuercher et al., discloses a method of detecting arcing by sensing cycle to cycle changes in the AC line current. Differences in samples taken at the same point in the AC cycle are then processed to determine whether arcing is occurring.

SUMMARY OF THE INVENTION

There is here disclosed a method and apparatus for detecting the occurrence of arcing of a conductor by monitoring the current on an AC power line. The signal detected is split and directed along four separate paths to generate four signals having separate characteristics which represent the current in the line. A first path is for a signal representative of the current flowing in the line. A second path is for a signal having a pulse for each occurrence of a positive step change in current that is significant and has a di/dt value above a predetermined value. A third path is for a signal having a pulse for each occurrence of a negative step change in current that is significant and has a di/dt value above a predetermined value. A fourth path is for a signal having a voltage level representative of the broadband noise signal on the line. Using at least one of five different methods in combination with one of three input signals, a reference signal designated as "SINE" is generated. The SINE signal generated in combination with a CURRENT input is used to produce a control waveform "DELTA". DELTA can be represented as a relative value or as an absolute difference between the SINE and the CURRENT. Each occurring half cycle of the DELTA signal is analyzed by, for example, a micro-controller for specific identifiable characteristics found to indicate the presence of arcing. Upon the detection of arcing, an output signal can be generated to activate a circuit interrupting mechanism, sound an audio alarm and/or alert a central monitoring station.

The arc detector of the present invention can be implemented as a stand alone device or it can be implemented in combination with an existing circuit interrupting device. The term "circuit interrupting device" is here defined to mean any electrical device used to interrupt current flow to a load and includes, but is not limited to devices such as Ground Fault Circuit Interrupters (GFCIs), Immersion Detection Circuit Interrupters (IDCIs) or Appliance Leakage Circuit Interrupters (ALCIs).

The arc detector here disclosed can be combined with other types of circuit interrupting devices such a GFCI, IDCI or ALCI to create a multipurpose device. In the case of a GFCI, the arc detection circuitry can be placed onboard the same silicon chip typically used in today's GFCI devices. In some instances, some of the pins of commonly used GFCI integrated circuits can be converted for multifunction operation. The AFCI can be powered from the same power supply that provides power to the circuit interrupting device. This combined approach can result in reduced manufacturing costs as the mechanical parts of the circuit interrupting device such as the trip relay and the mechanical contact closure mechanisms will serve dual purposes. In addition, adding AFCI circuitry to an existing circuit interrupting device is a logical enhancement of such present day devices. In particular, it is logical to enhance a GFCI with AFCI circuitry since a GFCI can detect arcing in certain situations including any condition whereby an arc produces leakage current to ground.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention is its broadest form.

BRIEF DESCRIPTION OF THE DRAWINGS

Other aspects, features, and advantages of the present invention will become more fully apparent from the following detailed description, the appended claim, and the accompanying drawings in which similar elements are given similar reference numerals.

DESCRIPTION OF THE PREFERRED EMBODIMENT(S)

Figure 1:
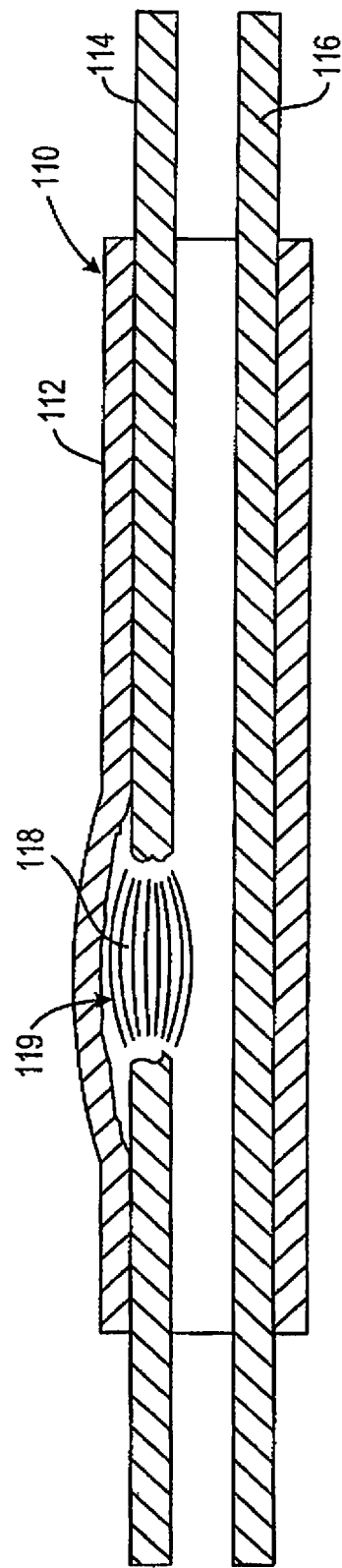
FIG. 1 is a schematic diagram illustrating an example of contact arcing in a current carrying conductor.
Figure 2:
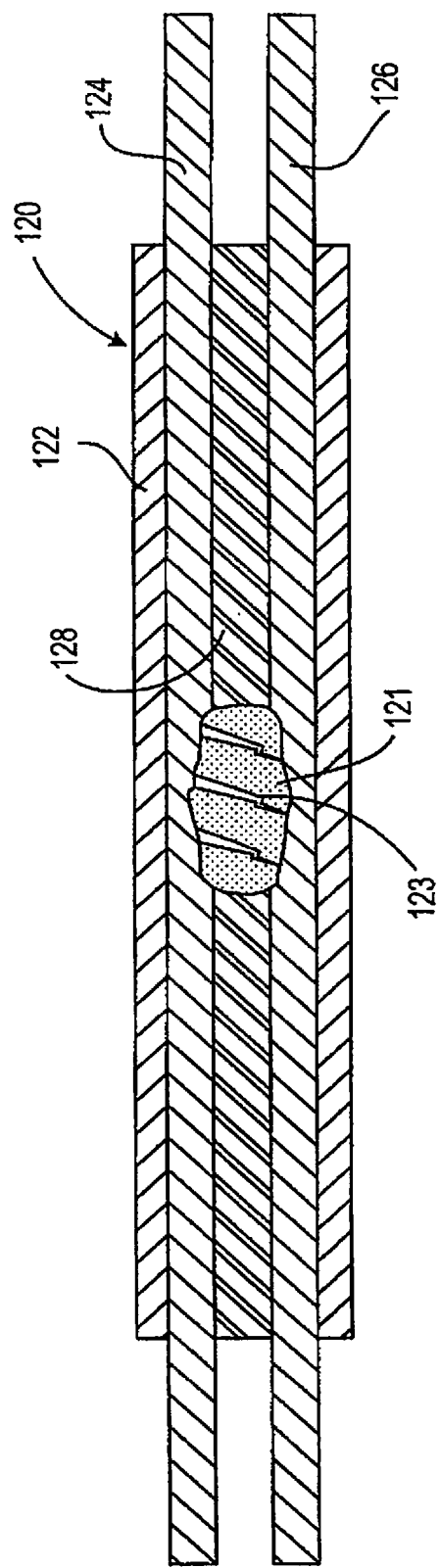
FIG. 2 is a schematic diagram illustrating an example of line arcing between two current carrying conductors.
Figure 3:
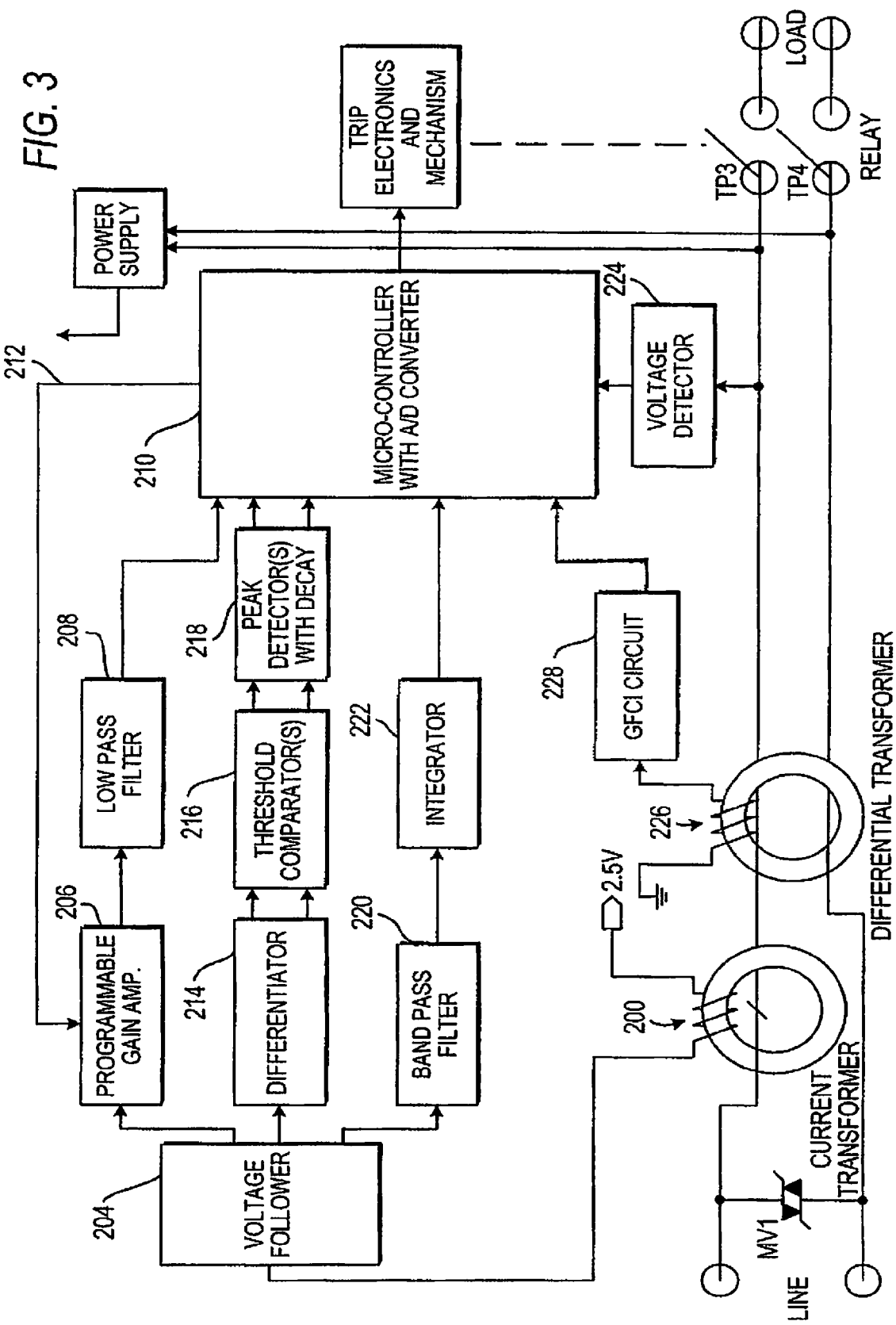
FIG. 3 is a block diagram of an Arc Fault Circuit Interrupter in accordance with the principles of the invention.

Referring to FIG. 3, there is illustrated a block diagram of structure in accordance with the principles of the invention. The current waveform present on the AC line is extracted via a toroidal current to voltage transformer 200. The transformer 200 should be capable of handling high currents (e.g. 200 A) in the primary with minimal saturation;

and provide high currents with minimal distortion of the signal produced on the secondary winding. Additionally, the transformer should have a bandwidth sufficient to pass the frequency signals used by the high frequency noise detection circuitry. In place of the transformer 200, a current shunt located in the line can be used. A purely resistive shunt has the benefit of not imposing a phase shift on the signal, while a current transformer has the benefit of providing isolation from the line. If a current transformer is used, one end of the secondary is referenced to 2.5 volts with the other end being connected to the input of a voltage follower 204. If a shunt is used in the line, the line side of the shunt is referenced to 2.5 volts. With a shunt, the voltage drop is referenced to its line side that is 180 degrees out of phase with the current flow. By making the amplifiers in the circuit inverting, the voltage signal representing the current is back in phase with the actual current before it is sampled by a micro-controller 210.

The voltage generated across the secondary winding of transformer 200 is fed to voltage follower 204 which splits the signal, by electronics, into three signals, each of which is directed along a specific path. The voltage follower and the specific paths along which the split signals are carried can be considered to be a signal modifying means. The voltage follower provides enough current to drive the output signals along the various paths regardless of the current supplied by the current transformer. A first output signal from the voltage follower is fed along a first path which consists of a programmable gain amplifier 206, the output of which is fed through a low pass filter 208 to the micro-controller which includes a digital-to-analog (D/A) converter 210. The first path provides the D/A converter with a representation of the current flowing in the line. The programmable gain amplifier 206 is controlled by a signal from the micro-controller via line 212, which scales the voltage signal to the amplifier 206 by one of a variety of scales. For example, three data lines from the micro-controller will produce 8 possible scales. A set of scales of x1, x2, x4, x8, x16, x32, and x64 was found to be sufficient to keep the signal at the A/D input sufficiently large, without clipping at 5V and 0V across the range of 5 A peak to 320 A peak.

The amplifier 206 is normally set to its most sensitive setting (x64) and the micro-controller will reduce the scaling as the A/D reads signals that have been clipped at 5V or 0V. Signals above 320 A are allowed to clip at 5V and 0V as these are abnormal current levels. The low pass filter 208 which follows the programmable gain amplifier cuts out high frequency noise and has a corner frequency roughly half the sampling frequency of the A/D converter.

A second signal from the voltage follower is used to generate two signals; one signal being a pulse for each occurrence of a positive step change in current that is significant and has a di/dt value above a predetermined value, and a second signal being a pulse for each occurrence of a negative step change in current that is significant and has a di/dt value above a predetermined value. The second signal from the voltage follower is fed to differentiator 214 which responds to the rate of change of current in the line. The two output signals of the differentiator are fed to two threshold comparators 216 which help to eliminate noise. The negative threshold output, compared to 2.5V, is fed to a negative peak detector with an RC network decay 218, which stretches any short lived negative di/dt signals. The positive threshold output, compared to 2.5v, is fed to a positive peak detector with an RC network decay 218, which stretches any short lived positive di/dt signals. The time constants of the two RC networks providing the peak decay are fast enough to allow the detection of more than one di/dt peak within a half cycle. The signals from the negative and positive peak detectors 218 are fed to the micro-controller 210.

A third signal from the voltage follower is used to produce a voltage having a level that is representative of the broadband noise signal on the line. The third signal from the voltage divider is fed to band pass filter 220, the output of which is fed thru an integrator 222 to the micro-controller 210. The signal representative of the broadband noise on the line is used to determine if an increase in broadband noise correlates with the general waveform arc characteristics. This input is given a higher weight if the current waveform is not sufficient, within a half cycle, to create a sine wave which can be compared with the current waveform. The main purpose of the band pass filter 220 is to remove the fundamental frequency (e.g. 60 Hz) and other low frequency components of the current signal. The integrator 222 produces a voltage level representative of the high frequency noise on the line. A programmable gain amplifier may also be employed following the band pass filter to provide a greater range of high frequency noise detection.

The signal from the low pass filter 208 represents the current in the line (CURRENT); the two signals from the peak detectors 218 represent the negative and positive di/dt of the current in the line (DIFF+ and DIFF−); and the signal from the integrator 222 represents the high frequency noise on the line (HFN). These four signals are fed to the A/D converter within the micro-controller where they are sampled. In FIG. 3, the A/D converter is shown as being an integral part of the micro-controller. However, if desired, the A/D converter can be separate from the micro-controller. A typical sampling rate is 32 samples per half cycle.

A fifth input to the micro-controller and A/D converter 210 is a line voltage signal from a voltage detector 224 which is sampled by the A/D converter for detecting zero crossings.

A sixth input to the micro-controller and A/D converter 210 is an amplified and filtered signal from a differential transformer 226 which encompasses both the phase and neutral wires of the line. This signal is integrated and compared with other signals within the micro-controller to provide ground fault detection in addition to arc fault detection. In some applications it may be desirable to separate the ground fault detection circuit 228 from the arc fault detection circuit to reduce the software overhead of the micro-controller without adding significantly to the circuitry on the PC board.

Ground Fault Circuit Interrupters (GFCI) are well known electrical devices in common use today. They are used to help protect against electrical shock due to ground faults. A GFCI is basically a differential current detector which trips a contact mechanism when 5 mA or more of unbalanced current is detected between the phase wire and the neutral wire of an AC electrical power line. The unbalanced current detected is assumed to be flowing through a human who accidentally touches the phase wire. The current flows through the human to ground rather than returning through the differential transformer via the neutral wire, to create the current imbalance described above. It is to be noted that, not only current through a human, but also an appliance with inherent leakage to ground of 5 mA or more will also trip the GFCI to disconnect the flow of current to the load.

Figure 4:
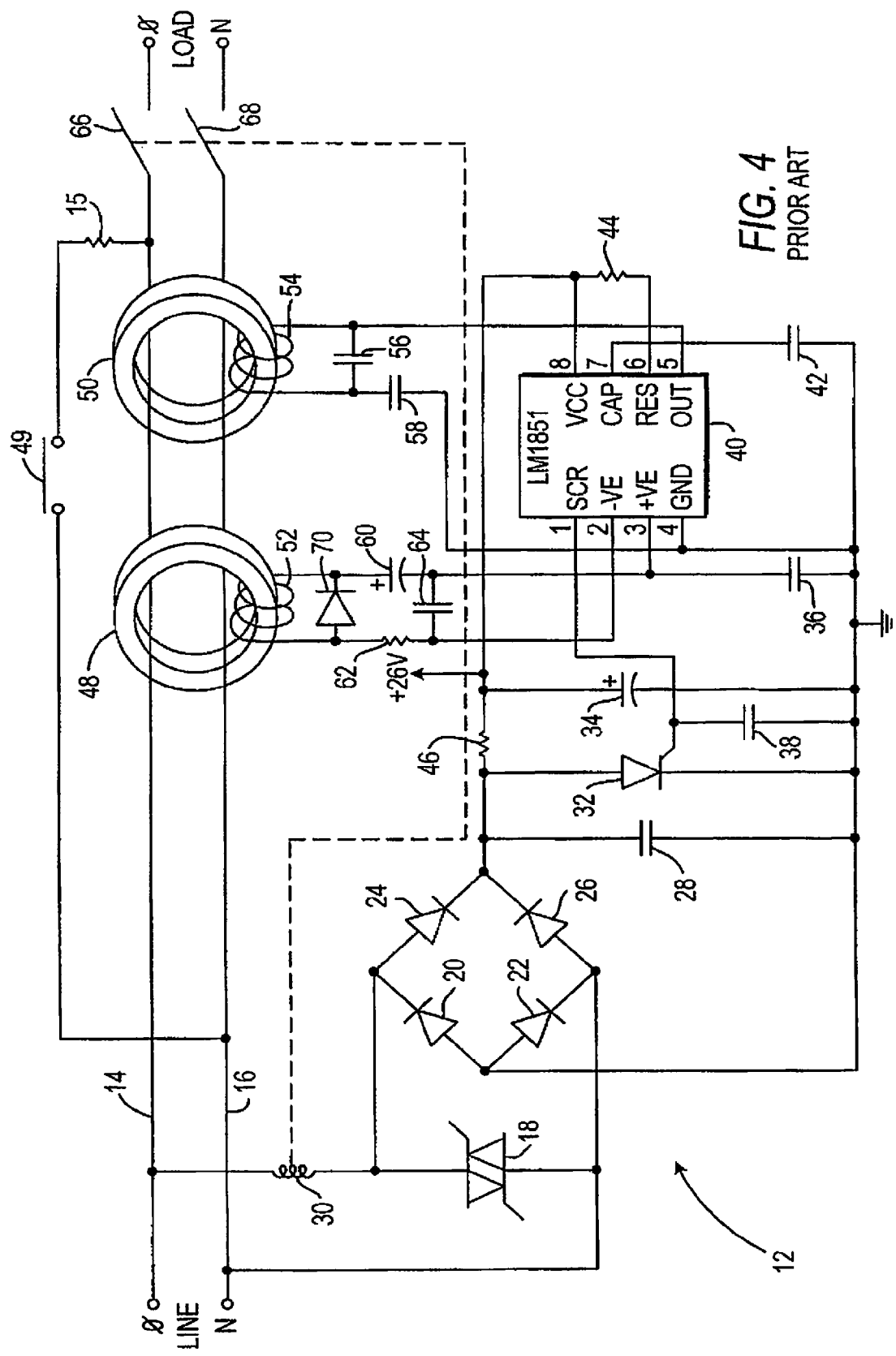
FIG. 4 is a schematic diagram illustrating a prior art ground fault circuit interrupter device.

A schematic diagram illustrating a prior art ground fault circuit interrupter (GFCI) device is shown in FIG. 4. A typical prior art GFCI, generally referenced 12, comprises two current transformers consisting of magnetic cores 48, 50 and coils 52, 54, respectively, coupled to integrated circuit 40 which may comprise the chip identified as LM 1851 manufactured by National Semiconductor. A relay coil 30 is placed between the phase and one input to a full wave bridge rectifier. AC power from the phase 14 and neutral 16 conductors is full wave rectified via a full wave rectifier comprising diodes 20, 22, 24, 26. A metal oxide varistor (MOV) 18 is placed across the phase and neutral conductors for protection. The output of the bridge is coupled across capacitor 28 and silicon controlled rectifier (SCR) 32. The gate of the SCR is coupled to ground via capacitor 38 and to pin 1 of chip 40.

A diode 70 located across the coil 52 is coupled to pins 2 and 3 via resistor 62 and capacitors 64, 60. Pin 3 is also coupled to ground via capacitor 36. Coil 54 is coupled to pins 4 and 5 of chip 40 via capacitors 58, 56. Pin 4 is also coupled to ground. Pin 6 of chip 40 is coupled to pin 8 via resistor 44 and pin 7 is coupled to ground via capacitor 42. Pin 8 is also coupled to capacitor 34 and to resistor 46. The voltage on pin 8 serves as the 26 V supply voltage for the GFCI circuitry. Line side electrical conductors, phase 14 and neutral 16, pass through the transformers to the load side phase and neutral conductors. A relay, consisting of switches 66, 68, associated with the phase and neutral conductors, respectively, function to open the circuit in the event a ground fault is detected. The switches 66, 68 are part of a double throw relay which includes coil 30. The coil 30 in the relay is energized when the GFCI circuitry turns on the silicon controlled rectifier (SCR) 32. In addition, the GFCI 12 comprises a test circuit comprised of a momentary push button switch 49 connected in series with a resistor 15. When the switch 49 is pressed, a temporary simulated ground fault, i.e., a temporary differential current path, from phase to neutral is created in order to test the operation of the GFCI 12.

As noted above, the arc fault detector here disclosed detects arcing in an AC electrical distribution system. From a broad band signal representative of the current in one of the conductors, four separate signals are generated. The first signal generated represents the current (CURRENT) flowing in the line. The second signal generated contains a pulse for each occurrence of a positive step change in current that is significant and has a di/dt value above a predetermined value (positive di/dt signal). The third signal generated contains a pulse for each occurrence of a negative step change in current that is significant and has a di/dt value above a predetermined value (negative di/dt signal). The fourth signal generated produces a voltage level indicative of the broadband noise signal on the line.

Figure 5:
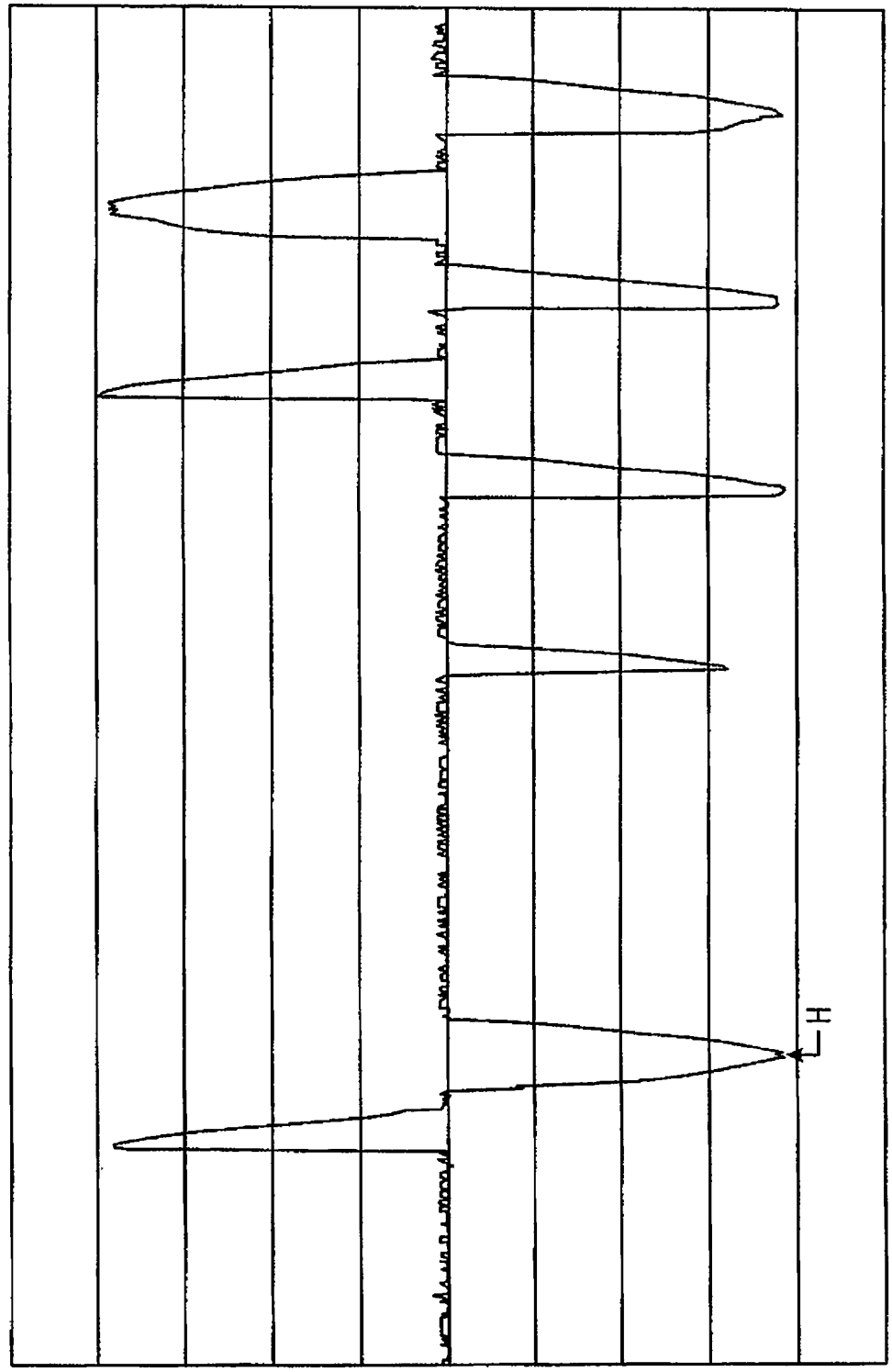
FIG. 5 is a plot of current waveform of an arcing signal.
Figure 6:
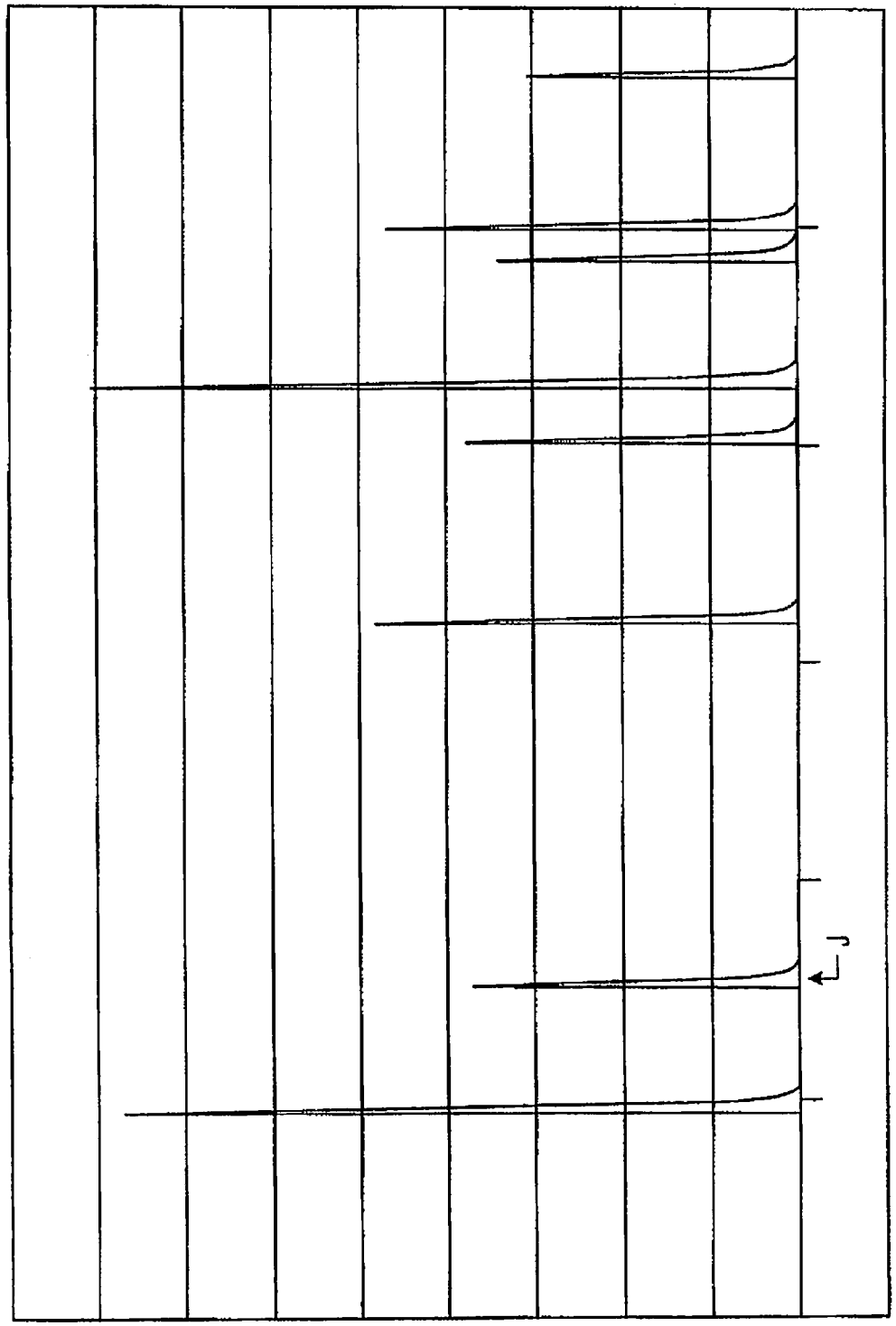
FIG. 6 is a plot of the positive di/dt signal fed to the micro-controller.
Figure 7:
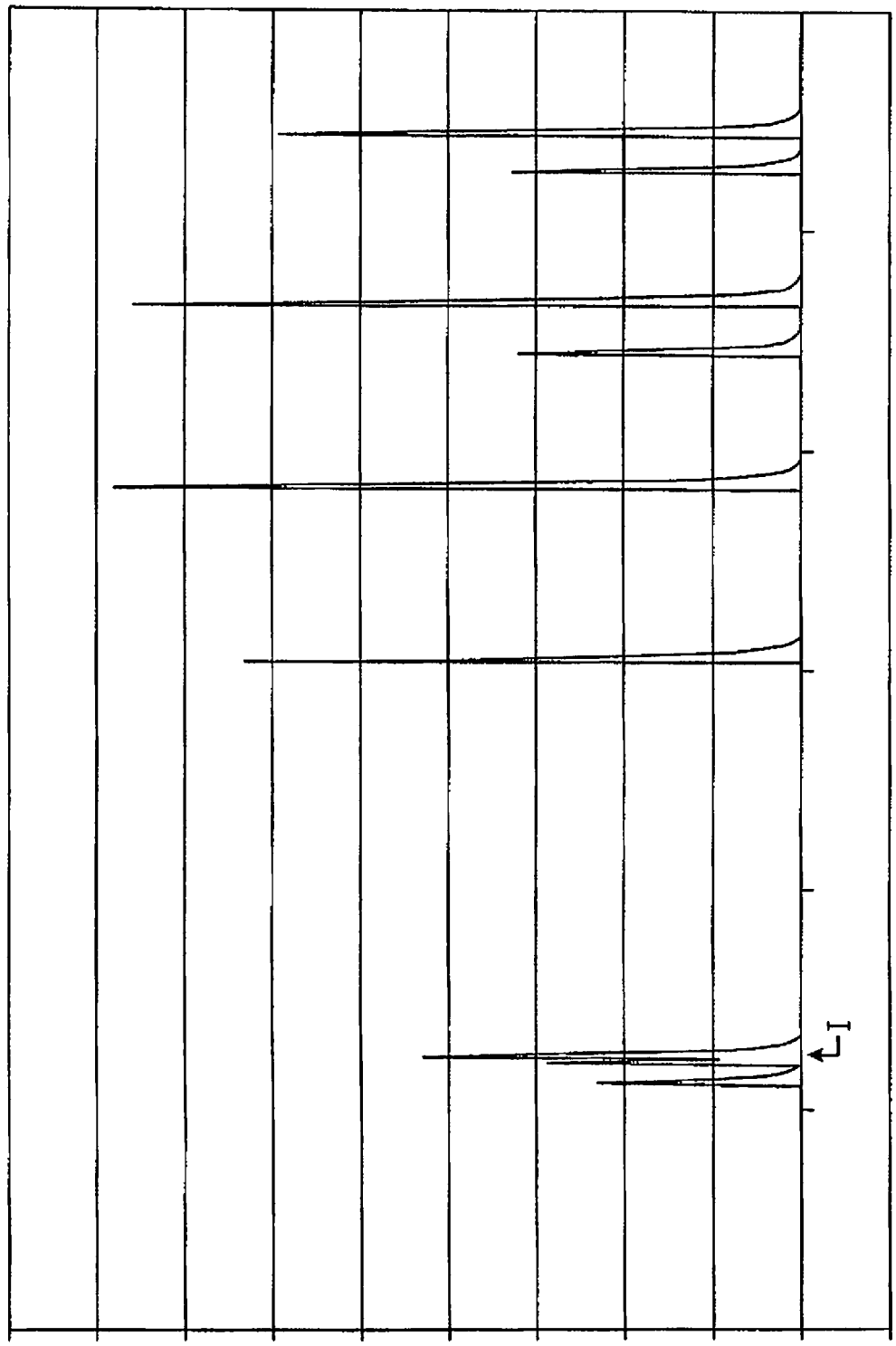
FIG. 7 is a plot of the negative di/dt signal fed to the micro-controller.
Figure 8:
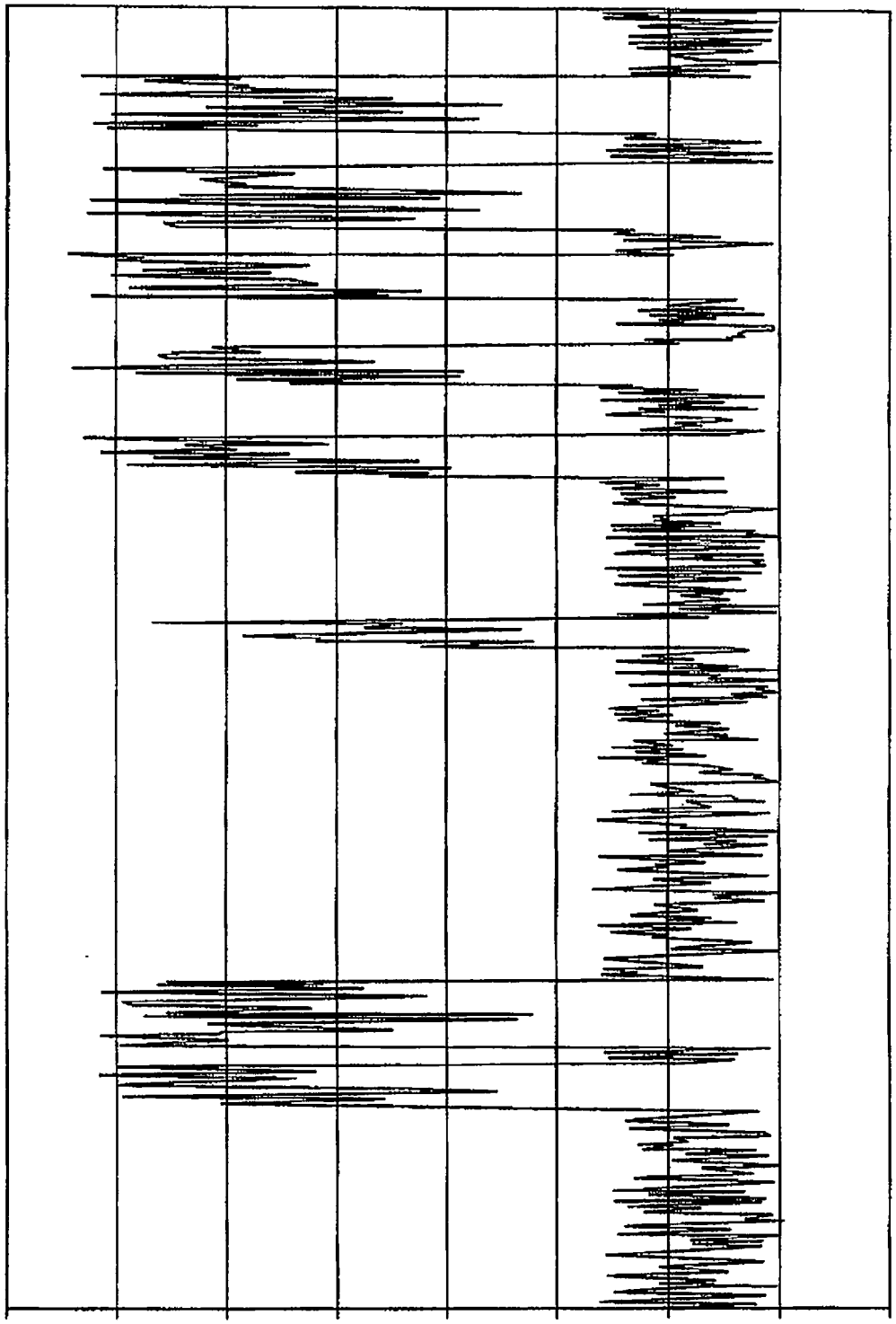
FIG. 8 is a plot of the noise signal fed to the micro-controller.
Figure 9:
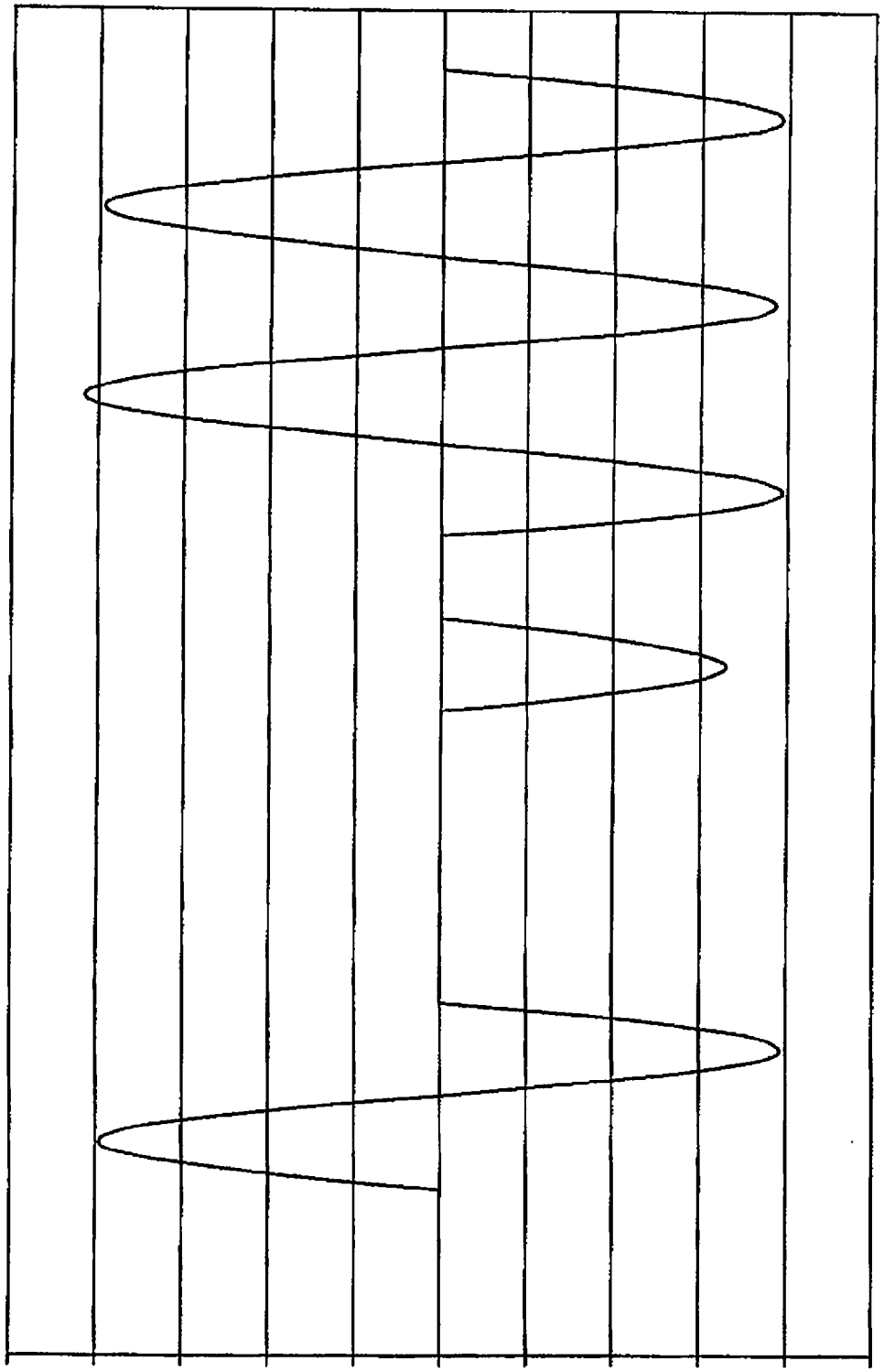
FIG. 9 is a plot of the created SINE waveform, the reference signal generated by the micro-controller; and, FIG. 10 is a plot of the Delta signal, the difference between the reference signal and the current signal.

FIG. 5 is a plot of a current waveform of an arcing signal. FIG. 6 is a plot of the positive di/dt signal. FIG. 7 is a plot of the negative di/dt signal. FIG. 8 is a plot of the wide band noise signal. The signal representative of the line current; the CURRENT signal; is compared with a SINE signal, in the time domain, to determine if it has the general waveform characteristics of arcing present and if half cycles of current that sometimes occur with sputtering arc faults are missing.

The SINE signal is generated by one of five algorithms each of which uses, as an input, the raw input current signal, or the signal from a multipoint running finite impulse response (FIR) or infinite impulse response (IIR) filter applied to the current signal. Thus, there is here disclosed fifteen separate and distinct methods for generating the SINE signal which is used to identify an arc fault.

Once the SINE is obtained for each half cycle of the CURRENT signal, the CURRENT signal is subtracted from the SINE to produce a waveform here referred to as the DELTA waveform.

The SINE is obtained as follows:

(1) Using a Finite Impulse Response (FIR) filter, infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) assume real zeros are exactly $\frac{1}{240}$ sec. on either side of the peak, (F) lockout $\frac{1}{4}$ cycle from leading zero cross when advancing to the next zero.

(2) Using a Finite Impulse Response (FIR) filter infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) assume zeros are exactly halfway between adjacent CURRENT peaks, (F) when advancing to next zero, begin looking at present peak.

(3) Using the CURRENT and Voltage data set sets from a multipoint running FIR and/or from multipoint IIR filters, (A) use the zero crosses from the FIR or IIR or the raw VOLTAGE waveform, and (B) use peak height of K (or 1) times FIR, IIR or raw CURRENT at the point halfway between the zeros to obtain the peak value of the CURRENT, where is applied to FIR or IIR data to correct for sampling of a pure sine wave.

(4) Using a Finite Impulse Response (FIR) filter, infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT, at that point to obtain the peak value of the CURRENT, where K is applied to FIR or IIR data to correct for sampling of a pure sine wave, (E) assume real zeros are exactly $\frac{1}{240}$ sec. on either side of the peak, (F) when advancing to the next zero, begin looking at the present peak.

(5) Using a Finite Impulse Response (FIR) filter infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) when advancing to next zero, begin looking at present peak, and (F) assume zeros are exactly X/2 on either side of peak, where X is the average frequency form the preceding three cycles of the FIR or IIR or raw VOLTAGE waveform.

The waveform DELTA can be represented as the absolute difference between the SINE and the CURRENT or it can be represented as a relative value. When DELTA is to be represented as a relative value, the following relationship can used to obtain DELTA:

$$DELTA = (SINE - CURRENT)/SINE$$

The running average of the current flowing in the line is also calculated from the CURRENT input. If the running average of the current in the line is above a preset value for a preset time, the Arc Fault Circuit Interrupter will trip. If the running average is low, more arc events will have to be detected before the Arc Fault Circuit Interrupter will trip. This process adds noise immunity to the device.

Figure 10:
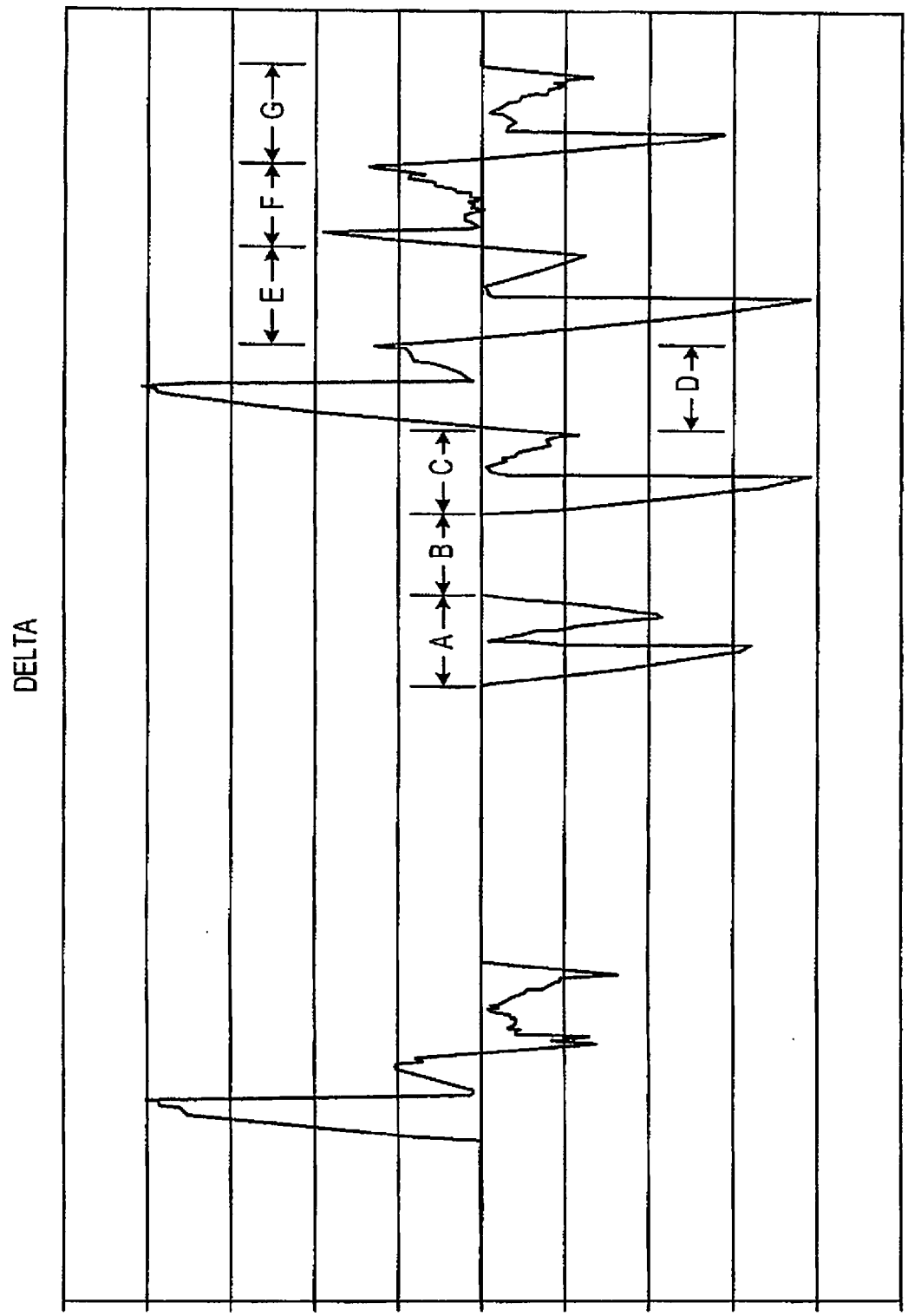

The DELTA data stream is analyzed by the micro-controller 210, continuously a half cycle at a time and, using at least one of the criteria below to determine if arcing is present:

Arcing is indicated if there are two peaks in the DELTA waveform within a half cycle. See FIG. 10, half cycles A, C, D, E and F.

Arcing is further indicated if the second peak of two peaks in a half cycle in the DELTA waveform is lower than the first peak. See FIG. 10, half cycles A, C, D, E and G.

Arcing is further indicated if the half cycles which contain two peaks within the DELTA waveform are surrounded by a period of one or more half cycles when a lower current flows. See FIG. 10, half cycles A and C on either side of half cycle B which, as illustrated in FIG. 5, is at a time when a lower current is flowing.

Under low load conditions the CURRENT signal may be too weak to create a SINE signal. This can occur, for example, when a load such a motor is phase dimmed at a low speed or the load is a light that is very dim. In this instance, the positive and negative di/dt Differential (DIFF) inputs and the High Frequency Noise (HFN) input signals are given more weight. The present invention employs the DIFF and HFN signals for arc detection as follows;

Arcing is indicted if two step-changes of current occur in a half cycle where the first has a di/dt spike of the same polarity as the current, and the second has a di/dt spike of opposite polarity to the current. See FIG. 5, current pulse H, a negative polarity pulse; FIG. 7, pulse I, the first going di/dt pulse having the same polarity as the current and FIG. 6, pulse J having a polarity opposite to the current.

Arcing is further indicated by randomness in the time between di/dt spikes. See FIGS. 6 and 7.

Arcing is further indicated by half cycles containing two di/dt spikes surrounding a period of one or more half cycles when a much lower arcing current is flowing.

Arcing is indicated when the HFN input signal is high between two di/dt spikes and is low during the rest of the half cycle.

Arcing is further indicated if the HFN input peaks between the two di/dt events.

Arcing is further indicated if the HFN follows a sine curve between the two di/dt events.

Arcing is further indicated by half cycles containing the above three HFN signal characteristics surrounding a period of one or more half cycles when a much lower HFN signal is present.

Upon determining that an arc fault has occurred, the micro-controller drives one of its output pins high which turns on an SCR by supplying current to the gate of the SCR through a resistor. The activated SCR operates a solenoid connected to open a pair of contacts to remove power from the load. A capacitor can be placed across the gate and cathode of the SCR to prevent it from being turned on by voltage spikes on the line.

While there have been shown and described and pointed out the fundamental novel features of the invention as applied to the preferred embodiments, it will be understood that various omissions and substitutions and changes of the form and details of the method and apparatus illustrated and in the operation may be done by those skilled in the art, without departing from the spirit of the invention.

What is claimed is:

1. An arc fault detector circuit for detecting an arc in an AC power line, the arc fault detector circuit comprising:
   a current sensor electrically coupled to the AC power line, wherein the current sensor is configured to output a raw current signal indicative of the current flowing in the AC power line;
   a signal processing circuit electrically coupled to the raw current signal, the signal processing circuit is configured to output:
      a positive step change pulse, the positive step change pulse being output upon the occurrence of a positive step change of the time differential of the raw current signal greater than a predetermined value;
      a negative step change pulse, the negative step change pulse being output upon the occurrence of a negative step change of the time differential of the raw current signal greater than a predetermined value; and
      a noise signal indicative of broadband noise on the AC power line;
   a controller electrically coupled to the output of the current sensor and the output of signal processing circuit, wherein the controller is configured to detect an arc fault on the AC power line based on one or more of the raw current signal, the positive step change pulse, the negative step change pulse, and the noise signal.

2. The arc fault detector circuit of claim 1 wherein the controller detects an arc fault based on a delta signal wherein the delta signal is calculated by comparing one or more of the raw current signal, the positive step change pulse, the negative step change pulse, and the noise signal with a pure sine signal.

3. The arc fault detector circuit of claim 2 wherein the delta signal is calculated by taking the difference between the raw current signal and the pure sine signal and dividing the difference by the raw current signal.

4. The arc fault detector circuit of claim 1 wherein the controller is configured to calculate a pure sine signal based on a computed amplitude and a computed frequency based on the raw current signal.

5. The arc fault detector circuit of claim 4 wherein the computed amplitude and computed frequency are based on a plurality of peaks of the raw current signal.

6. The arc fault detector circuit of claim 5 wherein the controller calculates the time locations of the zero crossing of the pure sine signal at 1/(4X) on each side of the plurality of peaks.

7. The arc fault detector circuit of claim 1 further comprising a differential transformer electrically coupled to the AC power line, wherein the differential transformer outputs a differential signal, the output of the differential transformer is electrically coupled to the controller;
   wherein the controller is configured to detect a ground fault on the AC power line based on the differential signal.

8. The arc fault detector circuit of claim 1 further comprising a differential transformer electrically coupled to the AC power line, wherein the differential transformer outputs a differential signal;
   a ground fault circuit electrically coupled to the differential transformer;
   wherein the ground fault circuit is configured to detect a ground fault on the AC power line based on the differential signal.

9. The arc fault detector circuit of claim 8 wherein the controller is configured to interrupt the AC power line upon the detection of a ground fault.

10. The arc fault detector circuit of claim 1 wherein the controller is configured to interrupt the AC power line upon the detection of an arc fault.

* * * * *